United States Patent
Hsu et al.

(10) Patent No.: US 6,552,398 B2
(45) Date of Patent: Apr. 22, 2003

(54) T-RAM ARRAY HAVING A PLANAR CELL STRUCTURE AND METHOD FOR FABRICATING THE SAME

(75) Inventors: Louis L. Hsu, Fishkill, NY (US); Rajiv V. Joshi, Yorktown Heights, NY (US); Fariborz Assaderaghi, Mahopac, NY (US)

(73) Assignee: IBM Corporation, Armonk, NY (US)

( * ) Notice: Subject to any disclaimer, the term of this patent is extended or adjusted under 35 U.S.C. 154(b) by 0 days.

(21) Appl. No.: 09/760,970

(22) Filed: Jan. 16, 2001

(65) Prior Publication Data

US 2002/0093030 A1 Jul. 18, 2002

(51) Int. Cl.$^7$ .................. H01L 29/78; H01L 29/745
(52) U.S. Cl. .................. 257/350; 257/140; 257/141; 257/162
(58) Field of Search .................. 257/350, 140, 257/141, 162

(56) References Cited

U.S. PATENT DOCUMENTS 5,824,584 A * 10/1998 Chen et al. .................. 438/267
6,104,045 A * 8/2000 Forbes et al. .................. 257/140

OTHER PUBLICATIONS

*A Novel–Thyristor–based SRAM cell(T–RAM) for High–Speed, Low–Voltage, Giga–scale Memories* by Farid Nemati and James D. Plummer, Center for Integrated Systems, Stanford, University, 1999.
*A Novel High Density, Low Voltage SRAM Cell with a Vertical NDR Device*, by Farid Nemati and James D. Plummer, Center for Integrated Systems, Stanford University, 1998.

* cited by examiner

Primary Examiner—Jerome Jackson
(74) Attorney, Agent, or Firm—Dilworth & Barrese, LLP

(57) ABSTRACT

A T-RAM array having a planar cell structure is presented which includes a plurality of T-RAM cells. Each of the plurality of T-RAM cells is fabricated by using doped polysilicon to form a self-aligned diffusion region to create a low-contact resistance p+ diffusion region. A silicided p+ polysilicon wire is preferably used to connect each of the plurality of the T-RAM cells to a reference voltage Vref. A self-aligned junction region is formed between every two wordlines by implanting a n+ implant into a gap between every two wordlines. The self-aligned junction region provides for a reduction in the T-RAM cell size from a cell size of $8F^2$ for a prior art T-RAM cell to a cell size of less than or equal to $6F^2$. Preferably, the T-RAM array is built on a semiconductor silicon-on-insulator (SOI) wafer to reduce junction capacitance and improve scalability.

16 Claims, 7 Drawing Sheets

T-RAM ARRAY HAVING A PLANAR CELL STRUCTURE AND METHOD FOR FABRICATING THE SAME

FIELD OF THE INVENTION

This invention relates to the field of integrated circuit (IC) design. Specifically, it relates to a Thyristor Random Access Memory (T-RAM) array having a planar cell structure and method for fabricating the same.

BACKGROUND OF THE INVENTION

A low-power, high-speed and high-density negative differential resistance (NDR) based (NDR-based) SRAM cell which can provide DRAM-like densities at SRAM-like speeds has been proposed by Farid Nemati and James D. Plummer in "A Novel High Density, Low Voltage SRAM Cell with a Vertical NDR Device," 1998 Symposium on VLSI Technology Digest of Technical Papers, EEE, pages 66–67, 1998.

The memory device structure is shown by FIG. 1 and is designated by reference numeral 10; the memory device structure is called a Thyristor-based Random Access Memory (T-RAM) cell. The T-RAM cell 10 consists of a thin vertical pnpn thyristor 12 with a surrounding nMOS gate 14 as the bistable element and a planar nMOSFET as the access transistor 16. The circuit schematic of the T-RAM cell 10 is shown by FIG. 2.

To access the T-RAM cell 10, two wordlines are necessary. The first wordline WL1 is used to control an access gate of the transfer nMOSFET device 16, while the second wordline WL2 is the surrounding nMOS gate 14 which is used to control the switch of the vertical pnpn thyristor 12. The thyristor 12 is connected to a reference voltage Vref. The second wordline WL2 improves the switching speed of the thyristor 12 from 40 ns to 4 ns with a switching voltage. A bitline BL connects the T-RAM cell 10 to a sense amplifier for reading and writing data from and to the T-RAM cell 10. The T-RAM cell 10 exhibits a very low standby current in the range of 10 pA.

When writing a "high", the bitline BL is set at low, and both wordlines WL1, WL2 are switched on. At this moment, the thyristor 12 behaves like a forward biased pn diode. After a write operation, both gates are shut off, and a "high" state is stored in the thyristor 12. In a read operation, only the first wordline WL1 is activated, a large "on" current will read on the bitline BL through the access gate. When writing a "low", the bitline BL is set at "high" state, and both wordlines WL1, WL2 are switched on. At this moment, the thyristor 12 behaves like a reverse biased diode. After the write operation, both gates are shut off, and a "low" state is stored in the thyristor 12. Similarly, in a consequence read, a very low current will be detected on the bitline BL. Further details of the operation of the T-RAM cell 10 and its gate-assisted switching are described in Nemati et al.; the contents of which are incorporated herein by reference.

A T-RAM array having a plurality of T-RAM cells 10 has demonstrated a density equivalent to that of DRAM arrays and a speed equivalent to that of SRAM arrays. Hence, the T-RAM array provides advantages afforded by both SRAM and DRAM arrays. These advantages make T-RAM an attractive choice for future generations of high speed, low-voltage, and high-density memories and ASICs.

However, there are several drawbacks of the T-RAM cell 10. First, there is the requirement of forming the thyristor 12 having a vertical pillar on a substrate during a fabrication process. Difficulties arise in controlling the dimensions of the vertical pillar and reproducing these dimensions for each T-RAM cell 10 in the T-RAM array. Second, due to the existence of a vertical thyristor 12 in each T-RAM cell 10, each T-RAM cell 10 is not planar and therefore difficult to scale. Third, it is difficult to control the dimension while forming the surrounding gate around the base of each vertical thyristor 12. Finally, due to these drawbacks, the resulting T-RAM cell 10 cannot be smaller than $8F^2$.

SUMMARY

An aspect of the present invention is to provide a T-RAM array having a planar cell structure for overcoming the disadvantages of the prior art.

Another aspect of the present invention is to provide a T-RAM array having a plurality of T-RAM cells, wherein each of the plurality of T-RAM cells has a planar cell structure.

Also, another aspect of the present invention is to provide a memory system having a plurality of T-RAM cells arranged in an array, wherein each of the plurality of T-RAM cells has a planar cell structure.

Finally, another aspect of the present invention is to provide a method for fabricating a T-RAM array having a planar cell structure.

Accordingly, in an embodiment of the present invention, a T-RAM array having a planar cell structure is presented.

In another embodiment of the present invention, a T-RAM array having a plurality of T-RAM cells is presented, wherein each of the T-RAM cells has a planar cell structure.

Further, in another embodiment of the present invention, a memory system having a plurality of T-RAM cells arranged in an array, wherein each of the T-RAM cells has a planar cell structure.

Further still, in another embodiment of the present invention, a method is presented for fabricating a T-RAM array having a planar cell structure. Each of the T-RAM cells in the T-RAM array is fabricated by using doped polysilicon to form a self-aligned diffusion region to create a low-contact resistance p+ diffusion region. A silicided p+ polysilicon wire is preferably used to connect each of the plurality of the T-RAM cells to a reference voltage Vref A self-aligned junction region is formed between every two wordlines by implanting a n+ implant into a gap between every two wordlines. The self-aligned junction region provides for a reduction in the T-RAM cell size from a cell size of $8F^2$ for a prior art T-RAM cell to a cell size of less than or equal to $6F^2$. Preferably, the T-RAM array is built on a semiconductor silicon-on-insulator (SOI) wafer to reduce junction capacitance and improve scalability.

DETAILED DESCRIPTION OF THE INVENTION

The present invention provides a T-RAM array having a plurality of T-RAM cells which are not provided with a vertical thyristor and a surrounding gate as prior art T-RAM cells. Hence, the T-RAM array of the present invention provides for less control during manufacturing, and is planar and more scalable than prior art T-RAM arrays. The present invention also provides a preferred method for fabricating the T-RAM array.

Figure 3:
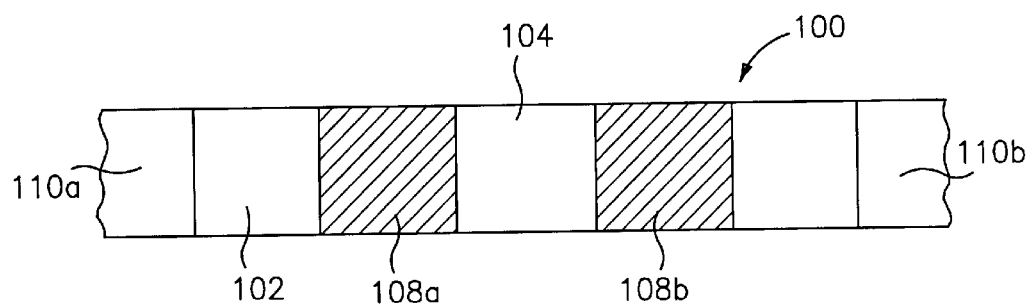
FIG. 3 is a top view of a portion of a semiconductor silicon-on-insulator (SOI) wafer having a series of 1F squares for fabricating T-RAM cells according to the present invention.

FIG. 3 is a top view of a portion of a semiconductor silicon-on-insulator (SOI) wafer having a series of 1F squares for fabricating T-RAM cells according to the present invention. 1F is a minimum printable dimension by the existing lithographic tool. The wafer is designated by reference numeral 100. It is contemplated that other types of semiconductor wafers besides semiconductor SOI wafers can be used for fabricating T-RAM cells according to the present invention.

A description of the preferred method for fabricating two adjacent T-RAM cells of the T-RAM array will now be provided. The same fabrication method is used for simultaneously fabricating all of the T-RAM cells of the T-RAM array. With reference to FIGS. 4A–12 there are shown cross-sectional views of the semiconductor wafer 100 for fabricating the two adjacent T-RAM cells. As indicated above, the semiconductor wafer 100 is a semiconductor SOI wafer, where active areas for fabricating devices are defined by shallow trench isolations (STI) 110a, 110b.

Figure 4A:
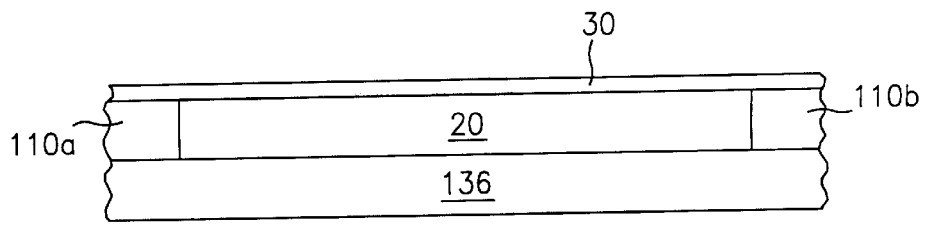
FIGS. 4A–12 are cross-sectional views illustrating a preferred process for fabricating two adjacent T-RAM cells according to the present invention.
Figure 4B:
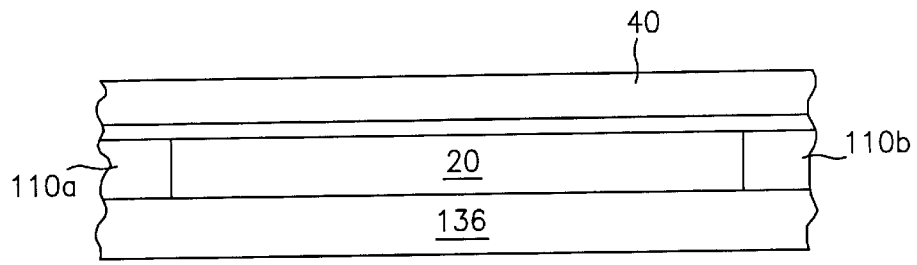

With reference to FIG. 4A, the semiconductor SOI wafer 100 having a buried oxide layer 136 and silicon layer 20 is used as the substrate to form the T-RAM cells. The STIs 110a, 110b are formed in a conventional manner. A composite sacrificial dielectric layer, e.g., CVD oxide and CVD nitride (e.g., 5 nm and 5 nm, respectively) 30 is deposited. As shown by FIG. 4B, a thick insulating layer 40, such as doped glass, or CVD oxide with a thickness of 200 nm is then deposited.

Figure 4C:
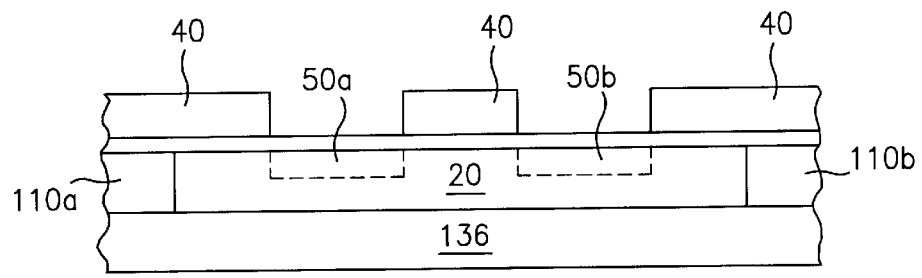

Referring to FIG. 4C, the insulating layer 40 is patterned to open up gate and channel regions 50a, 50b for forming the two adjacent T-RAM cells. Then, p dopant is implanted into the channel regions 50a, 50b to provide proper channel threshold adjustment dosage in the channel regions 50a, 50b.

Figure 4D:
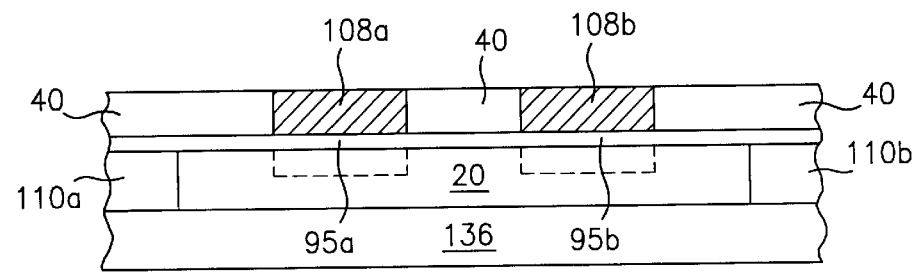
Figure 4E:
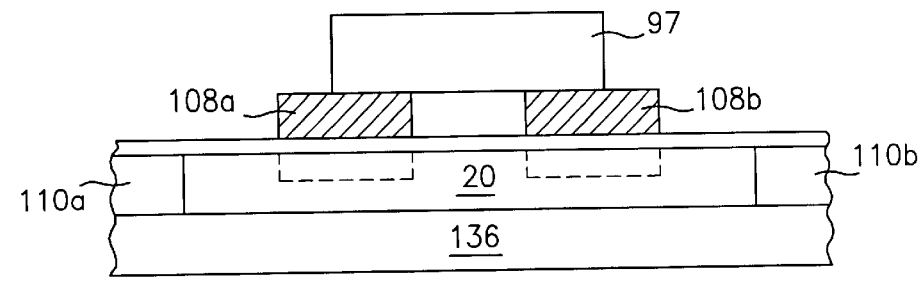

With reference to FIG. 4D, the sacrificial dielectric material in the channel regions 50a, 50 is then removed, and gate oxides 95a, 95b are grown. Then, n+ in-situ doped CVD polysilicon is deposited and planarized back to the insulating layer's surface by the chem-mech polish process. Two polysilicon gate regions 108a, 108b are then formed. Photoresist 97 is then patterned to protect the polysilicon gate regions 108a, 108b and the exposed insulating layer 40 is removed (see FIG. 4E).

Figure 4F:
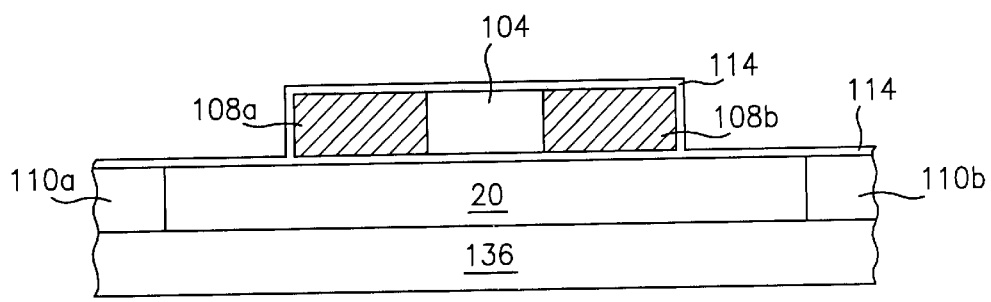

With reference to FIG. 4F, a layer of protective dielectric 114 is formed on a top surface of the SOI wafer 100. The thickness of the dielectric layer 114 determines the depth of a gap implant as described below.

Figure 5:
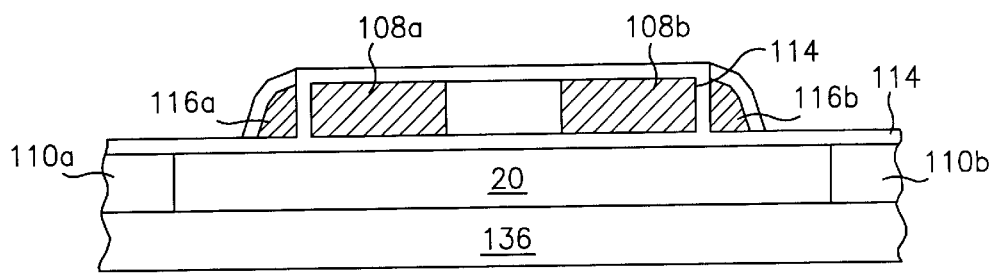

With reference to FIG. 5, sidewall spacer polysilicon gates 116a, 116b are formed along the sidewalls of the deposited polysilicon gate regions 108a, 108b. The deposited polysilicon gate regions 108a, 108b provide the first wordline WL1 and the sidewall spacer polysilicon gates 116a, 116b is the second wordline WL2 (see FIGS. 15 and 16).

Figure 6:
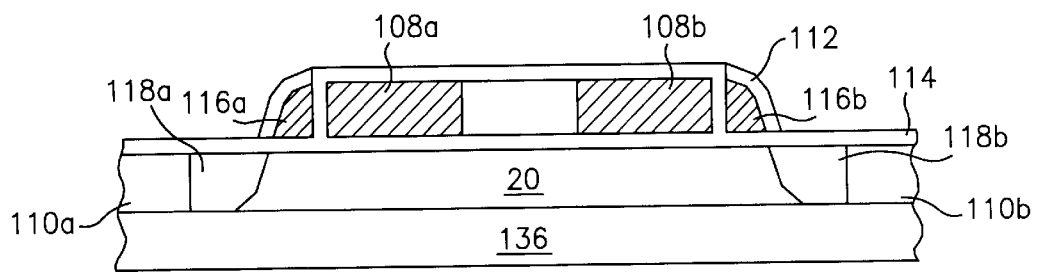

With reference to FIG. 6, device light drain implant regions 118a, 118b with n-type doping implant are formed and then another dielectric layer 112 is formed on top of the sidewall polysilicon spacer gates 116a, 116b. The implant regions 118a, 118b are preferably formed using an n-type arsenic, phosphorus or antimony implant. Preferably, the arsenic implant is at an energy in the range of 50–120 KeV and the quantity used is a dose of between $2E13/cm^2$ and $8E13/cm^2$. The phosphorus implant is at an energy in the range of 25–60 KeV and the quantity used is a dose of between $2E13/cm^2$ and $8E13/cm^2$. The antimony implant is at an energy in the range of 25–60 KeV and the quantity used is a dose of between $2E13/cm^2$ and $8E13/cm^2$. Implant regions 118a, 118b are also provided by p-type implants, such as boron and BF2 implants. Preferably, the boron implant is at an energy in the range of 5–30 KeV to a dose of between $4E13/cm^2$ and $1E14/cm^2$. The BF2 implant is at an energy in the range of 20–120 KeV to a dose of between $4E13/cm^2$ and $1E14/cm^2$. The structure is annealed using a conventional rapid thermal annealing tool for, preferably, 5 sec/wafer at a temperature range of 900–1025 degrees Celsius.

Figure 7:
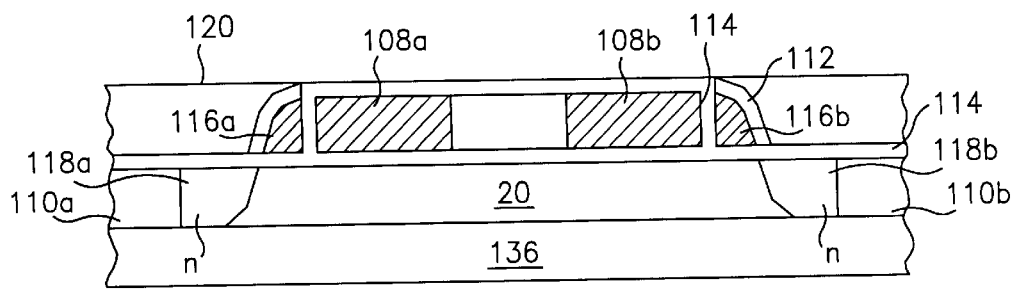
Figure 8:
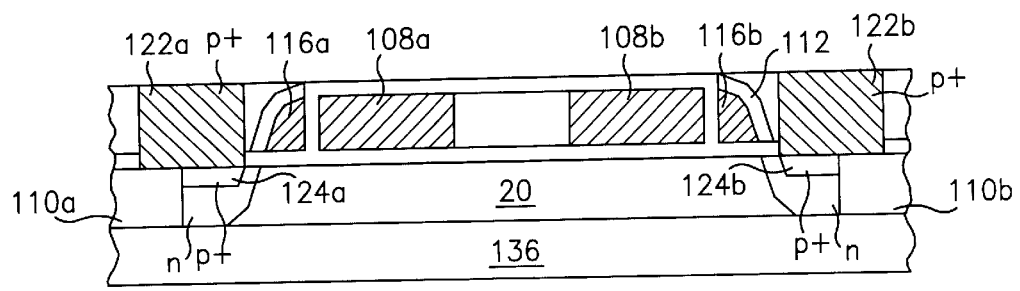

A thicker dielectric material 120 is then deposited and chem-mech polished to the polysilicon gate regions 108a, 108b (see FIG. 7). With reference to FIG. 8, p+ polysilicon Vref wiring regions 122a, 122b are formed using a mask and performing reactive ion etching to remove the insulating material 120 to expose lightly doped n-type drain regions below. Then, p+ doped polysilicon is deposited and polished back to the insulating material surface to form the p+ polysilicon Vref wiring regions 122a, 122b. After a drive-in diffusion process, p+ doped pockets 124a, 124b are formed inside of the n-type regions 118a, 118b. It is noted that the p+ polysilicon Vref wiring regions 122a, 122b are butted to the sidewall spacers 116a, 116b to avoid extra n-type doping implants.

Figure 9:
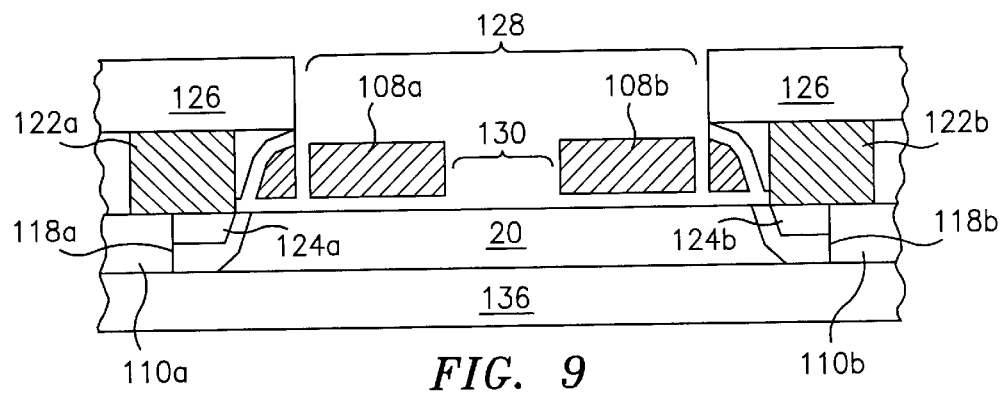
Figure 10:
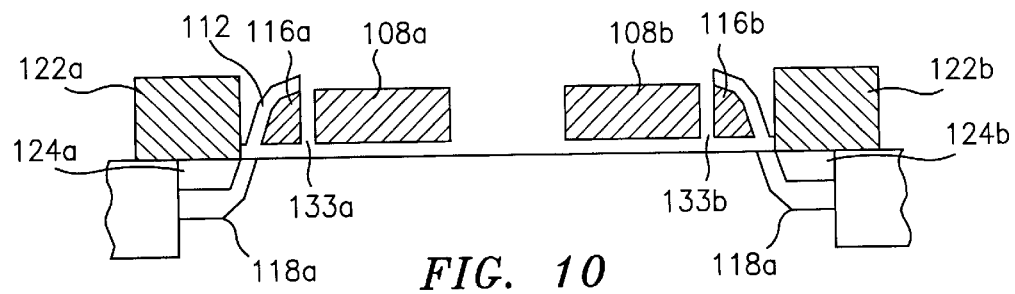

With reference to FIG. 9, a mask 126 having an opening 128 is used to open up a middle region between the two sidewall spacer polysilicon gates 116a, 116b. The alignment of the mask 126 is not critical, since a selective etch of oxide to polysilicon is conducted. After etching, only the dielectric material is removed in the region 128 and 133a, 133b are created.

Figure 11:
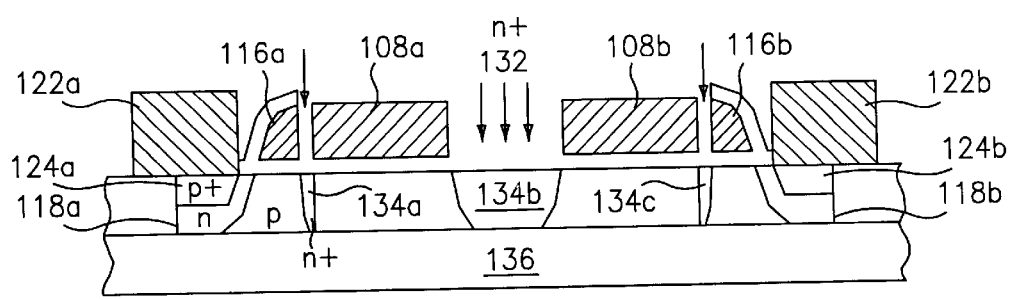

The photoresist is then removed (FIG. 10) With reference to FIG. 11, a n+ implant 132 is applied to the structure. The opening areas which includes the gaps 133a, 133b between sidewall spacer polysilicon gates 116a, 116b and the polysilicon gate regions 108a, 108b receive the n+ implant 132 to form n+ implant regions 134a, 134b, 134c. The gaps are sufficiently wide such that the n+ implant 132 reaches the surface of buried oxide layer 136. Preferably, n+ implant 132 is an arsenic implant having an energy in the range of 2–15 KeV and the quantity used is a dose of between $8E14/cm^2$ and $3E15/cm^2$. The structure is again annealed using the conventional rapid thermal annealing tool for, preferably, 5 sec/wafer at a temperature range of 900–1025 degrees Celsius.

Figure 12:
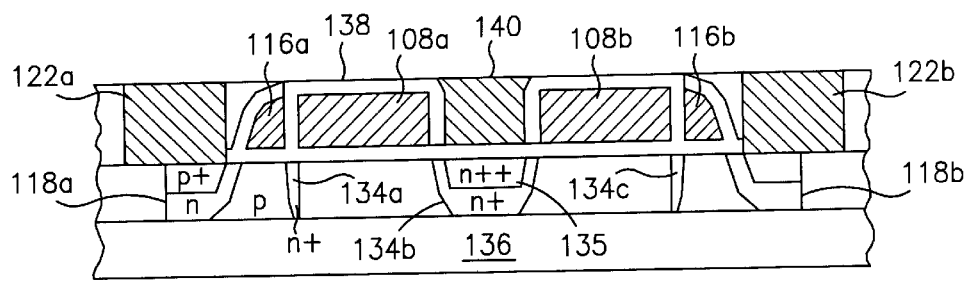

With reference to FIG. 12, a thin dielectric 138 is deposited and etch-back to the gate surfaces. This dielectric will fill the gaps 133a, 133b. A common bitline contact region 140 is formed using n+ in-situ doped polysilicon chem-mesh polish to form contact region 140. This drives the n+ dopant out from contact region 140 to form n++ contact diffusion region 135.

Figure 13:
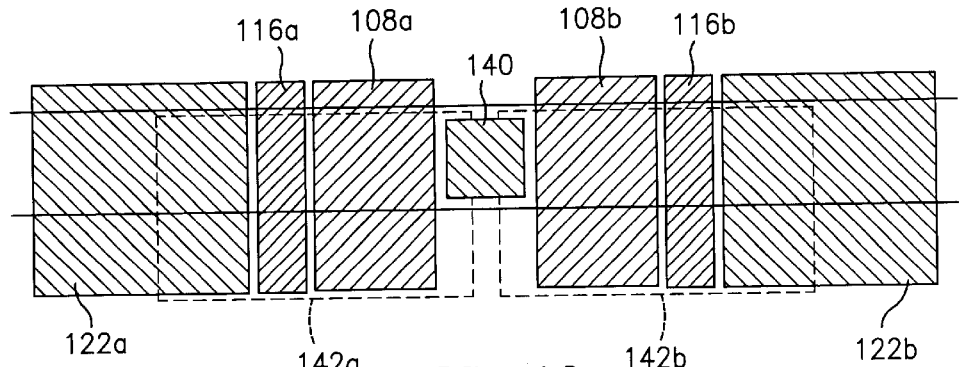
FIG. 13 is a top view of the two adjacent T-RAM cells fabricated according to the present invention.
Figure 14:
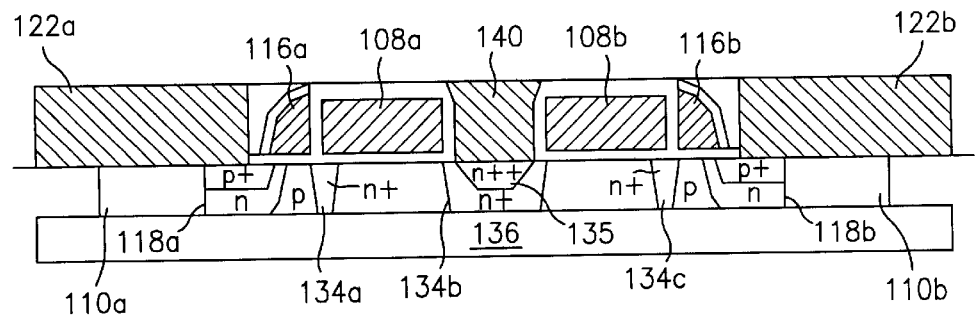
FIG. 14 is a cross-sectional view of the two adjacent T-RAM cells fabricated according to the present invention.
Figure 15:
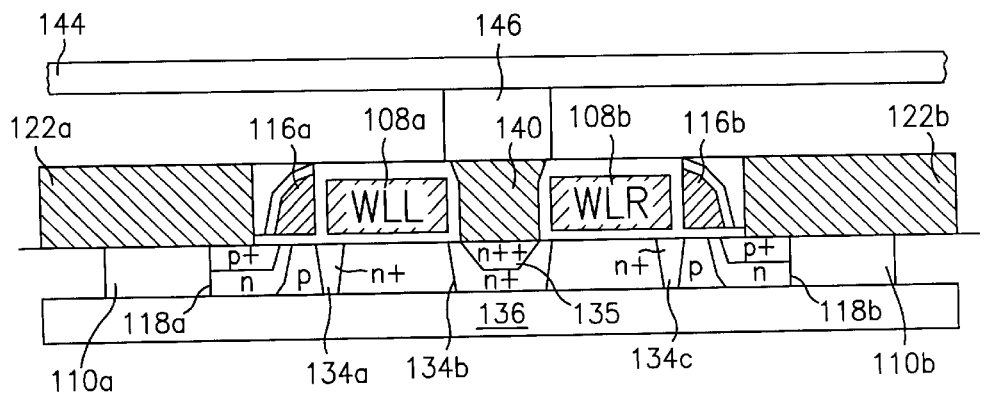
FIG. 15 is a cross-sectional view of the two adjacent T-RAM cells after formation of a bitline and a bitline contact.

FIGS. 13 and 14 illustrate a top view and a cross-sectional view, respectively, of two adjacent T-RAM cells 142a, 142b fabricated according to the above described method. These figures show a pair of polysilicon gate regions 108a, 108b, a pair of sidewall spacer polysilicon gates 116a, 116b, the Vref wiring regions 122a, 122b, and the common bitline contact region 140. Each of the T-RAM cells 142a, 142b has a size of less than or equal to 6F². With reference to FIG. 15, a bitline 144 and a bitline contact 146 are finally formed over the T-RAM cells 142a, 142b.

Figure 16:
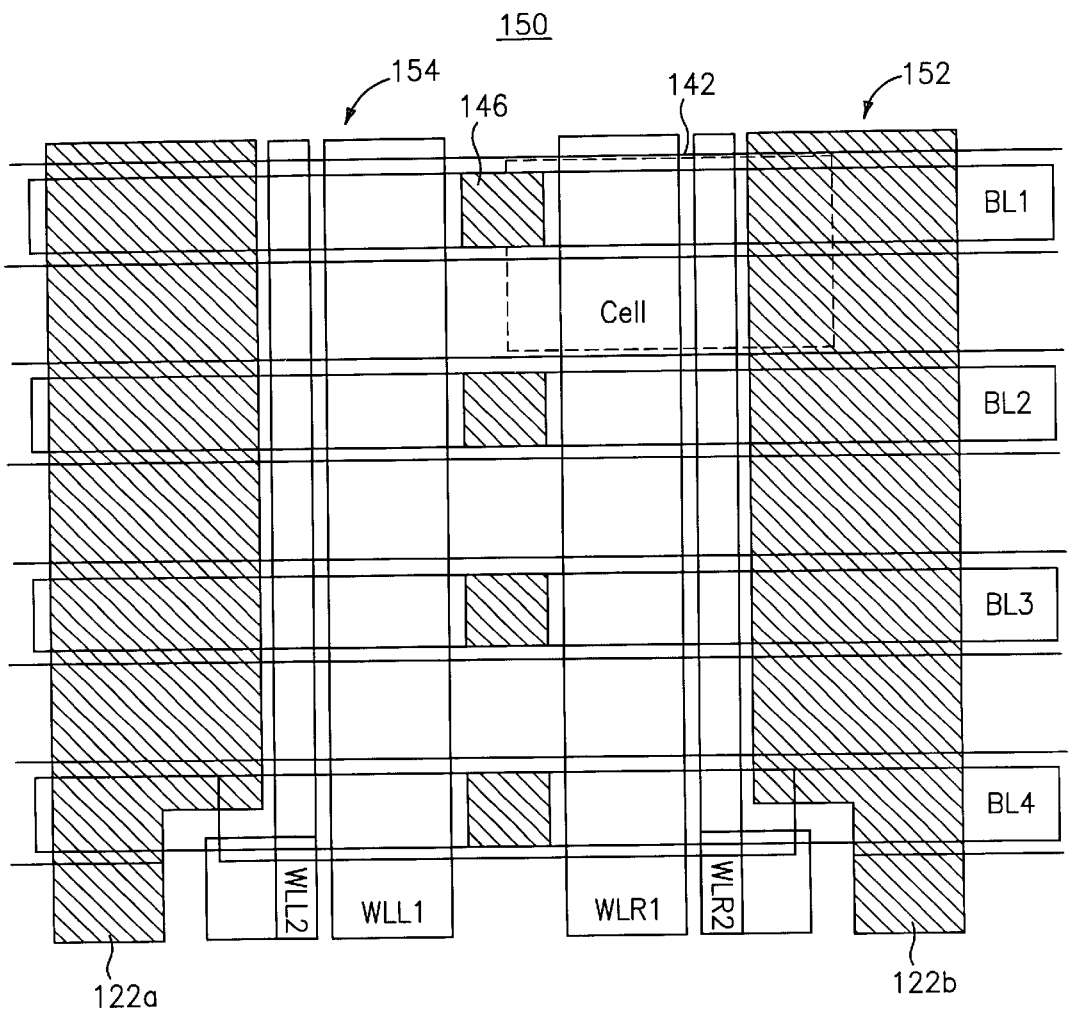
FIG. 16 is a top view of a portion of a T-RAM array having a plurality of T-RAM cells fabricated according to the present invention.

FIG. 16 is a top view of a portion of a T-RAM array having a plurality of T-RAM cells 142 fabricated according to the present invention. The T-RAM array designated generally by reference numeral 150, has symmetrical right and left T-RAM cells 142 located in a right cell region 152 and a left cell region 154, respectively. Each of the T-RAM cells 142 has a size of less than or equal to 6F². Each of the bitlines BL1–BL4 of the portion of the T-RAM array 150 lie in the horizontal direction and pass through a bitline contact 146 located between the right and left T-RAM cells 142.

In the right cell region 152, there are two wordlines, i.e., WLR1 and WLR2, and in the left cell region 154, there are also two wordlines, i.e., WLL1 and WLL2. Each of the cell regions 152, 154 also include Vref wiring regions 122a, 122b which provide the reference voltage Vref to each of the T-RAM cells 142. Since the Vref wiring regions 122a, 122b are wide, it is contemplated to widen the sidewall spacer wordlines WLR2, WLL2 at the edge of the T-RAM array 150 for better contactability. The T-RAM array 150 is designed for incorporation within a memory system.

Figure 1:
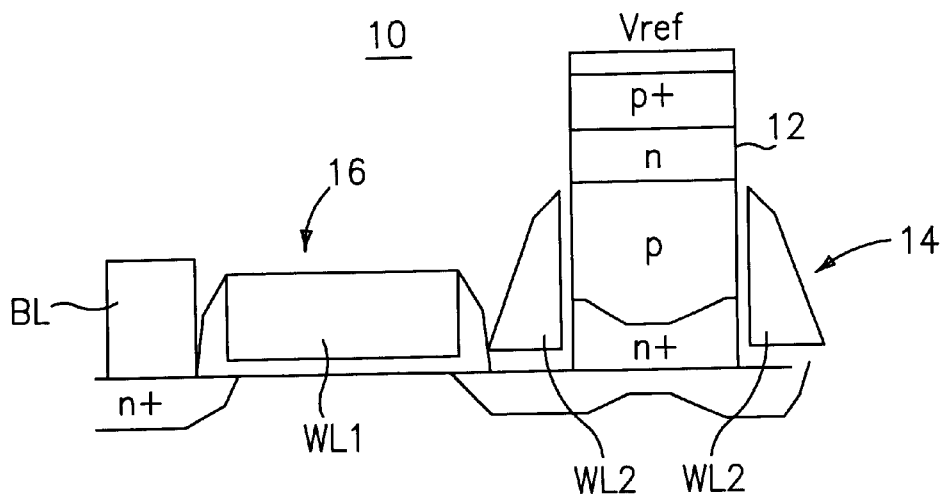
FIG. 1 illustrates the device structure of a prior art T-RAM cell.
Figure 17:
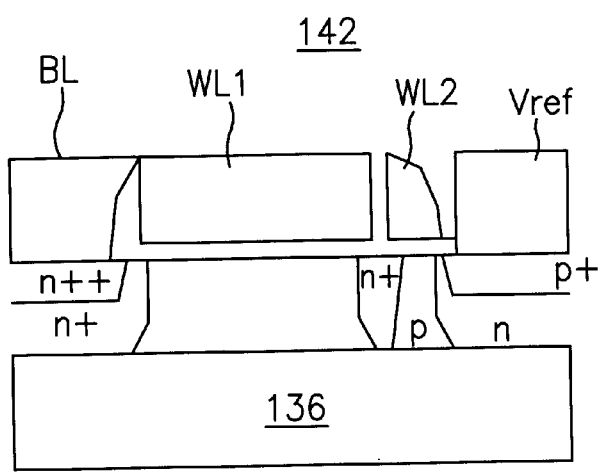
FIG. 17 illustrates the device structure of the T-RAM cell according to the present invention.
Figure 2:
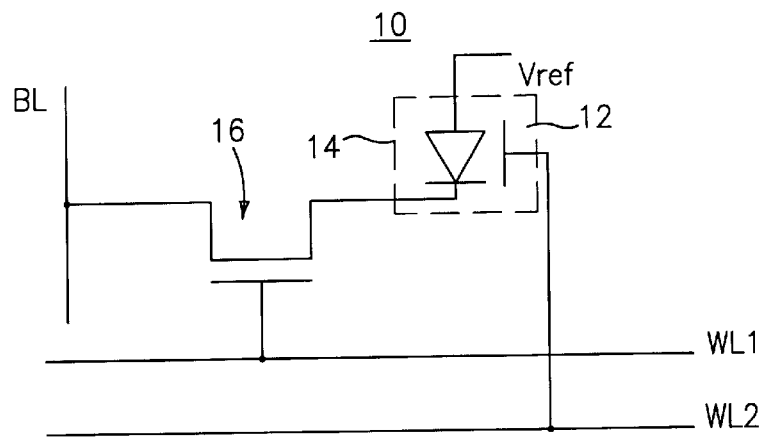
FIG. 2 is a circuit diagram of the prior art T-RAM cell.

FIG. 17 illustrates the device structure of the T-RAM cell 142 according to the present invention. When compared to the device structure of the prior art T-RAM cell 10 (FIG. 1), it is evident that the T-RAM cell 142 of the present invention is smaller. Further, the T-RAM cell 142 of the present invention is more planar than the prior art T-RAM cell 10, since it has a lateral-gated, i.e., planar, pnpn thyristor which includes a sidewall spacer switching device. Further still, the T-RAM cell 142 of the present invention does not have the surrounding gate 14 of the prior art T-RAM cell 10.

What has been described herein is merely illustrative of the application of the principles of the present invention. Other arrangements and methods may be implemented by those skilled in the art without departing from the scope and spirit of this invention.

We claim:

1. A memory system comprising a plurality of Thyristor-based Random Access Memory ("T-RAM") cells having a planar cell structure, the T-RAM cells each having a lateral-gated thyristor device coupled to a transfer gate, and a common bitline contact region formed between transfer gates of adjacent T-RAM cells.

2. The memory system according to claim 1, wherein each of said plurality of T-RAM cells includes a lateral-gated thyristor and a transfer device.

3. The memory system according to claim 2, wherein said lateral-gated thyristor includes a sidewall spacer switching device.

4. The memory system according to claim 2, wherein said lateral-gated thyristor includes a doped p+ polysilicon contact.

5. The memory system according to claim 4, wherein said doped p+ polysilicon contact is connected to a reference voltage.

6. The memory system according to claim 1, wherein each of said plurality of T-RAM cells has a size of less than or equal to square of 6 times a minimum feature size.

7. The memory system according to claim 1, wherein said plurality of T-RAM cells are fabricated on a semiconductor SOI wafer.

8. The memory system according to claim 1, wherein said plurality of T-RAM cells are arranged in an array.

9. A Thyristor-based Random Access Memory ("T-RAM") array comprising a planar cell structure, wherein the T-RAM array includes a plurality of T-RAM cells each having a lateral-gated thyristor device coupled to a transfer gate, and a common bitline contact region formed between transfer gates of adjacent T-RAM cells.

10. The T-RAM array according to claim 9, wherein said T-RAM array comprises a plurality of T-RAM cells, wherein each of the plurality of T-RAM cells has a planar cell structure.

11. The T-RAM array according to claim 10, wherein each of said plurality of T-RAM cells includes a lateral-gated thyristor and a transfer device.

12. The T-RAM array according to claim 11, wherein said lateral-gated thyristor includes a sidewall spacer switching device.

13. The T-RAM array according to claim 11, wherein said lateral-gated thyristor includes a doped p+ polysilicon contact.

14. The T-RAM array according to claim 13, wherein said doped p+ polysilicon contact is connected to a reference voltage.

15. The T-RAM array according to claim 1, wherein each of said plurality of T-RAM cells of said T-RAM array has a size of less than or equal to square of 6 times a minimum feature size.

16. The T-RAM array according to claim 9, wherein said T-RAM array is fabricated on a semiconductor SOI wafer.

* * * * *